US007500169B2

(12) United States Patent
Lin (10) Patent No.: US 7,500,169 B2
(45) Date of Patent: Mar. 3, 2009

(54) TURBO DECODER, TURBO DECODING METHOD, AND TURBO DECODING PROGRAM

(75) Inventor: Hua Lin, Tokyo (JP)

(73) Assignee: NEC Corporation, Tokyo (JP)

( * ) Notice: Subject to any disclaimer, the term of this patent is extended or adjusted under 35 U.S.C. 154(b) by 581 days.

(21) Appl. No.: 11/190,922

(22) Filed: Jul. 28, 2005

(65) Prior Publication Data

US 2006/0026485 A1 Feb. 2, 2006

(30) Foreign Application Priority Data

Jul. 28, 2004 (JP) ............................. 2004-219456

(51) Int. Cl.
*H03M 13/00* (2006.01)
(52) U.S. Cl. ....................... 714/755; 714/786; 714/795; 375/262; 375/341
(58) Field of Classification Search ................. 714/755, 714/786, 794, 752, 798, 799, 753, 795; 375/262, 375/341
See application file for complete search history.

(56) References Cited

U.S. PATENT DOCUMENTS

| 6,182,261 | B1 | 1/2001 | Haller et al. | |
| 6,563,890 | B2 * | 5/2003 | Obuchi et al. | 375/341 |
| 6,598,204 | B1 * | 7/2003 | Giese et al. | 714/795 |
| 6,760,879 | B2 * | 7/2004 | Giese et al. | 714/755 |
| 6,813,743 | B1 * | 11/2004 | Eidson | 714/795 |
| 7,127,664 | B2 * | 10/2006 | Nicol et al. | 714/792 |
| 7,191,377 | B2 * | 3/2007 | Berens et al. | 714/755 |
| 7,200,799 | B2 * | 4/2007 | Wang et al. | 714/795 |
| 2001/0052099 | A1 * | 12/2001 | Yano et al. | 714/755 |
| 2002/0094038 | A1 | 7/2002 | Okamura | |

FOREIGN PATENT DOCUMENTS

| EP | 1 009 098 | 6/2000 |
| JP | 2002-314437 | 10/2002 |
| WO | WO 02/07453 | 1/2002 |
| WO | WO 2004/038929 | 5/2004 |

OTHER PUBLICATIONS

An Intuitive Justification and a Simplified Implementation of the MAP Decoder for Convolutional Codes, Andrew J. Viterbi, Feb. 2, 1998.
Matache, A. et al., "Stopping rules for turbo decoders", *TMO Progress Report*, No. 42-142, Aug. 15, 2000, pp. 1-22, XP002225478.

* cited by examiner

*Primary Examiner*—Jacques H Louis-Jacques
*Assistant Examiner*—Fritz Alphonse
(74) *Attorney, Agent, or Firm*—Young & Thompson (57) ABSTRACT

A sliding window turbo decoder is provided which is capable of reducing large amounts of arithmetic calculations required for decoding and of achieving decoding processing that can reduce power consumption. An input code block is divided into a plurality of windows on which forward and backward processing is performed to realize a plurality of times of iterated decoding. At every time of iterated decoding, CRC (Cyclic Redundancy Check) is made by the CRC processing section and, according to the CRC processing result, a training size (length) for training processing on an initial value to be used in path metric calculations in a backward direction in a subsequent decoding is adjusted and controlled and, if the result is good, decoding is stopped. Power consumption is reduced while decoding capability is maintained.

23 Claims, 10 Drawing Sheets

$L0(5) = \alpha(4,7) + \beta(5,6) + \gamma(7,6)$
$L1(5) = \alpha(4,4) + \beta(5,0) + \gamma(4,0)$
$L(5) = L0(5) - L1(5)$ Note: $\alpha$ = Alpha
$\beta$ = Beta
$\gamma$ = Gamma
$L$ = Soft Output Value

TURBO DECODER, TURBO DECODING METHOD, AND TURBO DECODING PROGRAM

BACKGROUND OF THE INVENTION

1. Field of the Invention

The present invention relates to a turbo decoder, a turbo decoding method, and a turbo decoding program and more particularly to improvements of a high-performance and highly-reliable turbo decoding method to decode turbo codes to be used in communication systems and/or information processing systems in particular.

The present application claims priority of Japanese Patent Application No. 2004-219456 filed on Jul. 28, 2004, which is hereby incorporated by reference.

2. Description of the Related Art

In recent years, a turbo coding method, as a high-performance and highly-reliable coding method to be used in a wide range of communication fields and information processing fields including mobile communication systems, information storing systems, digital broadcasting systems, or a like, which generates turbo codes (developed by C. Berrou et al.) as an error-correcting code to realize a transmission characteristic being near to a limit shown in Shannon's theorem has been studied and developed.

Figure 4:
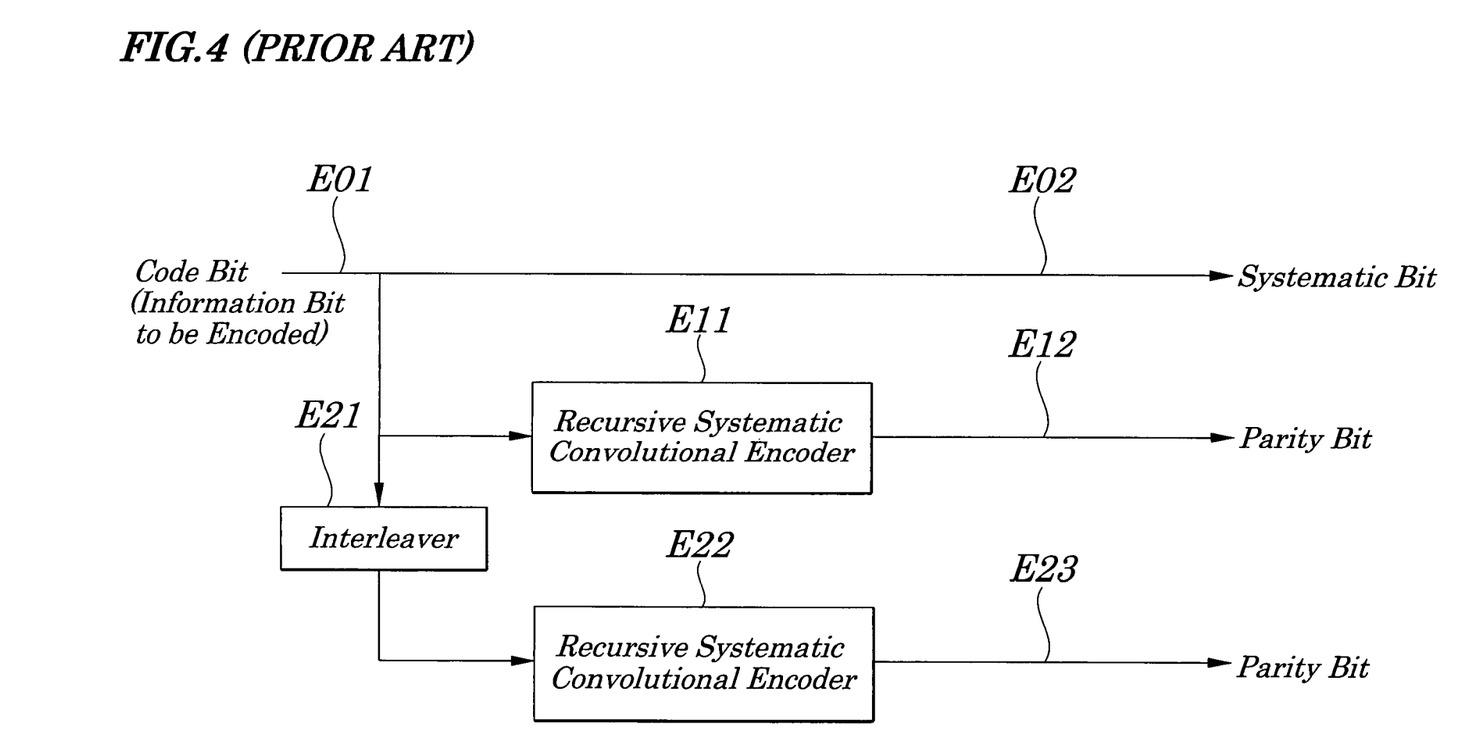
FIG. 4 is a schematic block diagram showing configurations of a conventional turbo encoder being generally used.
Figure 5:
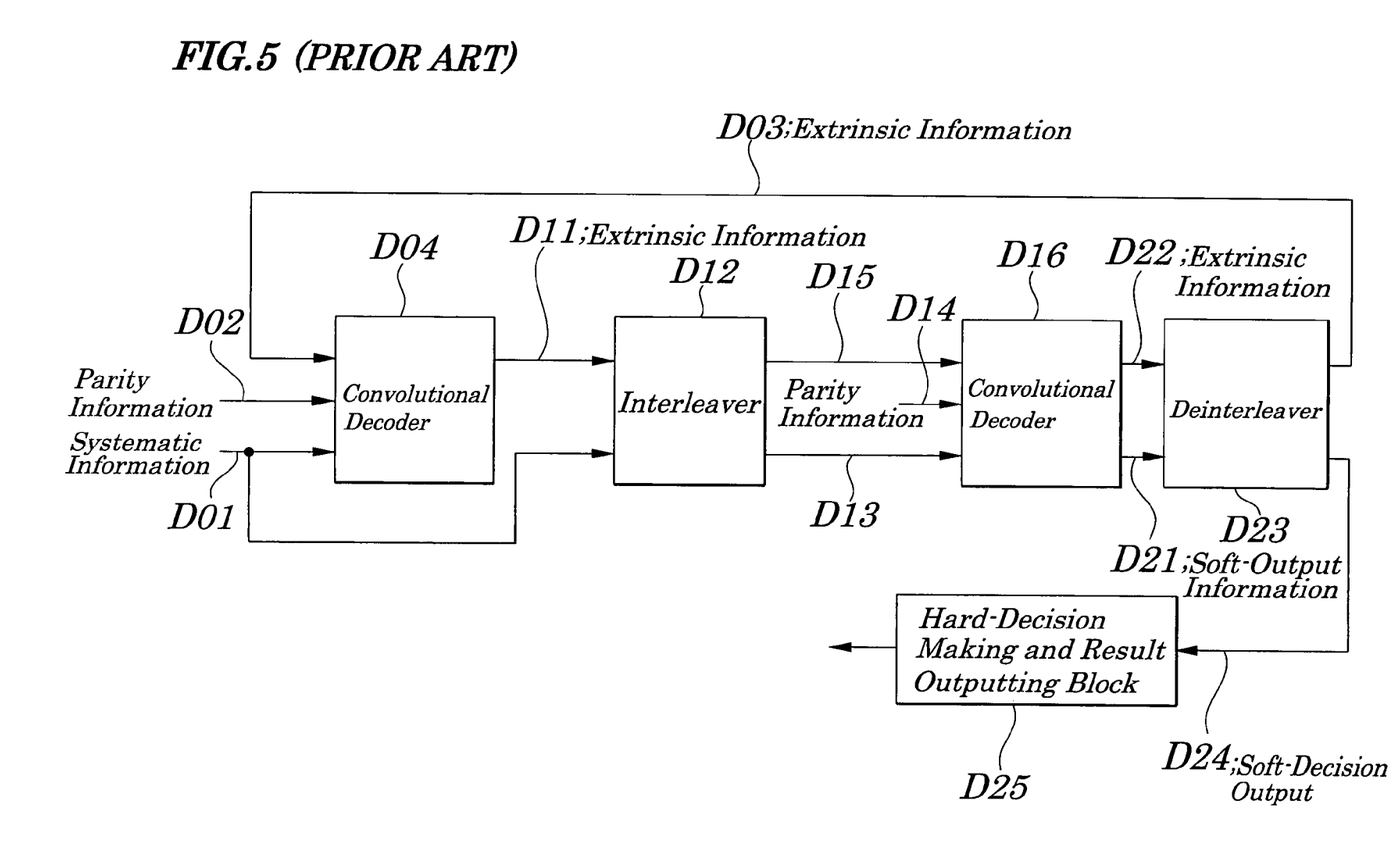
FIG. 5 is a schematic block diagram showing configurations of a conventional turbo decoder being generally used.

First, a turbo encoder and turbo decoder being generally and conventionally used are described. FIGS. 4 and 5 are schematic block diagrams showing configurations of the conventional turbo encoder and turbo decoder. FIG. 4 is a schematic block diagram showing the turbo encoder having a code rate being ⅓. The turbo encoder shown in FIG. 4 includes convolutional encoders E11 and E22 and an interleaver E21. A sequence of information bits to be encoded E01, is divided and is transmitted as a sequence of systematic bits and is input to the convolutional encoder E11 and to the interleaver E21.

The convolutional encoder E11 encodes the sequence of the information bit to be encoded E01 using an error-correcting code and outputs a sequence of a parity bit E12. The interleaver E21, by generally writing the sequence of the information bit to be encoded E01 once into memory and by reading the sequence of the information bit to be encoded E01 from the memory in the order being different from that used in the writing, outputs data having an interleaved order of the data to the convolutional encoder E22. The convolutional encoder E22, by encoding the sequence of the interleaved information bit to be encoded using an element code and outputs a parity bit sequence E23. As the convolutional encoders E11 and E22, an RSC (Recursive Systematic Convolutional) encoder is ordinarily used.

As shown in FIG. 5, the turbo decoder includes convolutional decoders D04 and D16, an interleaver D12, a deinterleaver D23, and a hard-decision making and result outputting block D25. To the convolutional decoder D04 are input a systematic information sequence D01 corresponding to the systematic bit sequence E02, a parity information sequence D02 corresponding to the parity bit sequence E12, and an extrinsic information D03. Output extrinsic information D11 is then used by the next convolutional decoder D16.

Furthermore, the obtained extrinsic information D11 and systematic information sequence D01, together with a parity information sequence D14 corresponding to the parity bit sequence E23, are input through the interleaver D12 to the convolutional decoder D16. Then, soft-output information obtained by the convolutional decoder D16 and an extrinsic information D22 are output to the deinterleaver D23.

The deinterleaver D23 outputs information in the order being the reverse of the order in which data is interleaved by the interleaver D12. That is, the interleaved order of soft-output information D21 and extrinsic information D22 is restored to the original order of the information before being interleaved and the information is output as soft-decision information D24 and the extrinsic information D03. The hard-decision making and result outputting block D25 makes a hard decision on the soft-decision output information D24 and outputs a finally decoded result. The extrinsic information D03 is fed back to the convolutional decoder D04 so that the information is used in subsequent processing.

As described above, in the turbo decoder shown in FIG. 5, while extrinsic information D03 and D15 output from the two convolutional decoders D04 and D16 are being renewed, decoding processing is repeated and, after a plurality of numbers of times of looping processing has been performed, a hard-decision is made on the soft-decision output information D24.

It is reported that, as a soft-output decoding method to be applied to a convolutional decoder for the turbo decoding, a MAP (Maximum A Posteriori Probability) decoding method is the best at present. However, a Max-Log-MAP (Max Logarithmic Maximum A Posteriori) decoding method is generally and widely used in which, since a scale of the convolutional decoder or an amount of processing is remarkably large, at the time when the algorithm of the method is actually employed in the convolutional decoder, its processing is made simplified by determining whether the transmitted data is "1" or "0" according to a maximum value of likelihood.

Figure 6A:
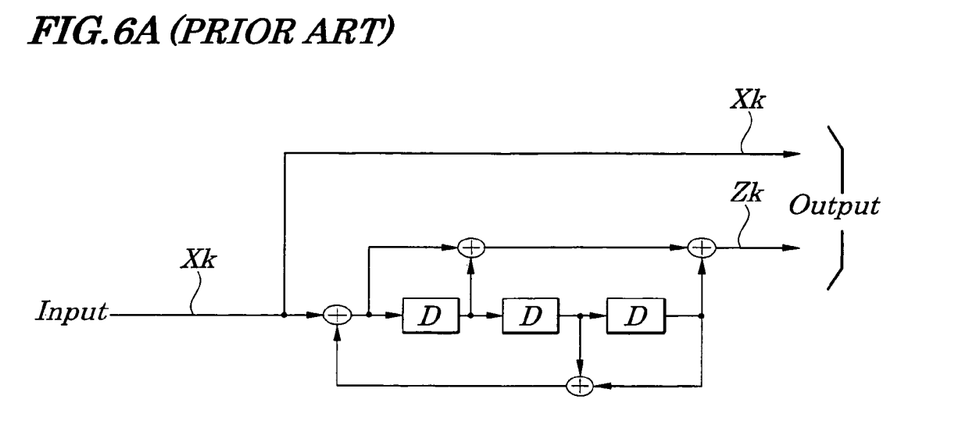
FIG. 6A is a diagram showing an example of configurations of a convolutional decoder and FIG. 6B is a diagram showing a Trellis diagram.
Figure 6B:
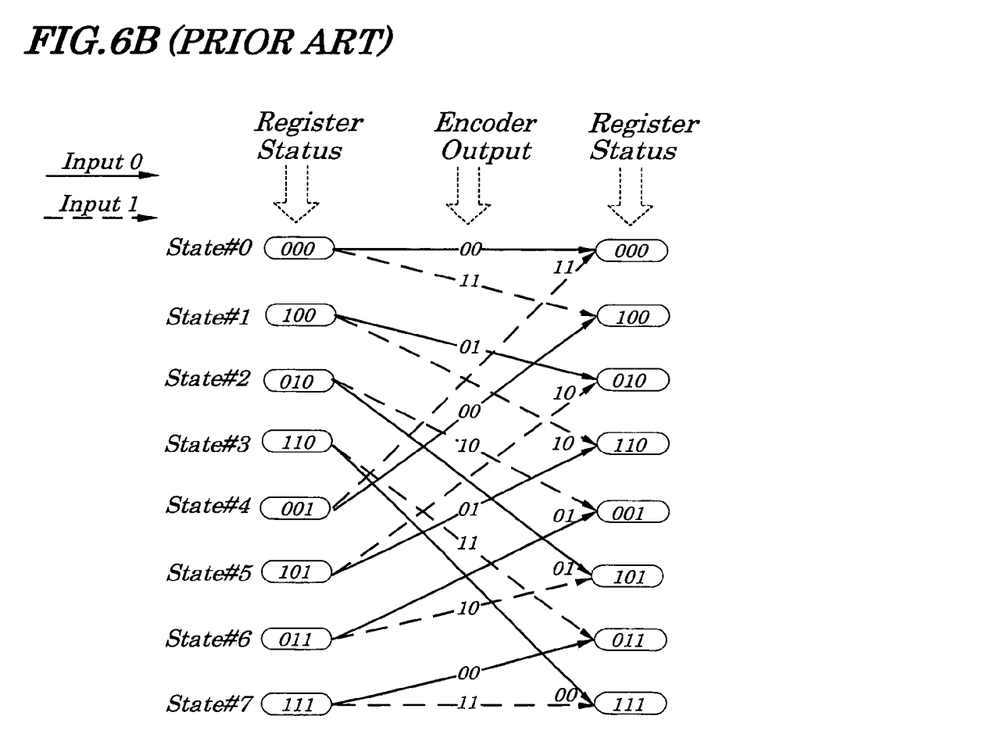

The MAP algorithm serves as a maximum likelihood decoding algorithm using a Trellis diagram. FIG. 6A shows a diagram illustrating an example of configurations of a convolutional decoder in which the number of registers is three. The Trellis diagram, as shown in FIG. 6B, shows a relation between an output value obtained when a value is input to the convolutional decoder and states of registers.

The MAP algorithm is classified roughly into the following three types:

(a) Forward processing: Probability (forward path metric value) of reaching from a head point in a Trellis diagram to each state at each time point in the Trellis diagram is calculated.

(b) Backward processing: Probability (backward path metric value) of reaching from an end point in a Trellis diagram to each state at each time in the Trellis diagram is calculated.

(c) Soft-output generating processing and calculations of extrinsic value: A soft-output value of a systematic bit at each time point is calculated by using results from the above (a) forward processing and (b) backward processing. Then, by using the soft-output value, an extrinsic value is calculated.

In the Trellis diagram, the forward path metric value and the backward path metric value calculated in each of the forward processing and backward processing at a time point "t" and in a state "s" are represented as Alpha (t, s) and Beta (t, s), respectively. Moreover, probability of transition from the state "s" to the state "s'" at the time point "t" is represented as Gamma (t, s, s') (here, the Gamma is called a "branch metric value"). The Gamma is a probability that can be obtained from a received value (systematic information sequence, parity information sequence, and extrinsic information).

Each of the forward processing, backward processing, soft-output generating processing, and extrinsic value calculations described above are made as follows:

(a) Forward processing:

$$\text{Alpha}(t, s) = \text{Max}\{\text{Alpha}(t-1, s') + \text{Gamma}(t, s', s)\}$$

Here, the equation indicates that the processing "Max" to calculate a maximum value is performed in all states "s'"

Figure 7A:
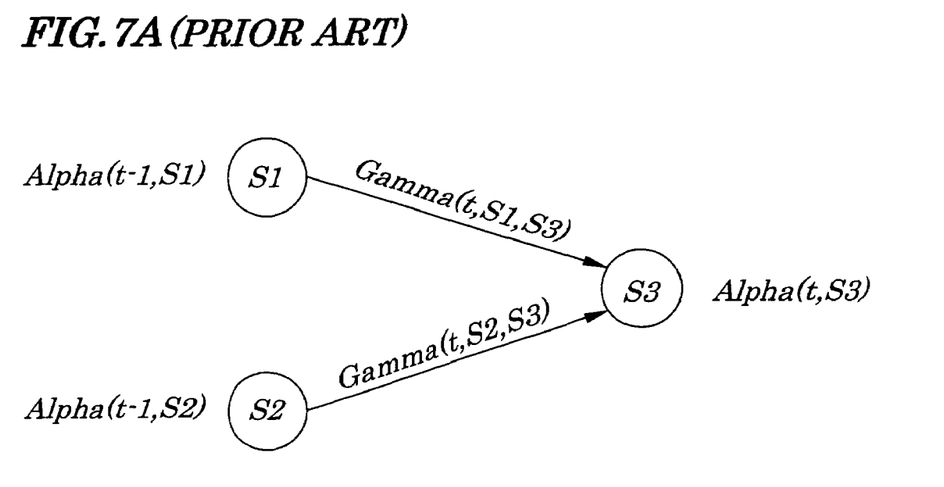
FIGS. 7A and 7B are diagrams examples of ACS (Add-Compare-Select) arithmetic calculations for the Alpha (a) and Beta (b) according to the embodiment of the present invention.

As shown in FIG. 7A, Alpha (t, S3) for the State (S3) at time point "t" is calculated as follows: Branch metric Gamma (t, S1, S3) and Gamma (t, S2, S3) are added respectively to a path metric Alpha (t−1, S1) and path metric Alpha (t−1, S2) occurring in two pre-stage States and a value being larger becomes an Alpha value in the State (this is called "Alpha ACS arithmetic calculations"). This processing is performed in all the States at all time transitions "t" and an Alpha value in all the States is held.

Since no Alpha value occurs at a previous-stage in the first calculations of an Alpha value, setting of an initial value is required. Here, since the transition starts all the time from the State #0 in the Trellis diagram, as the initial Alpha value, the Alpha value is designated as "0" in the Stage #0 and Alpha value as a "−MAX" value (minimum value) in states other than the State #0.

(a) Backward Processing:

$$\text{Beta}(t, s) = \text{Max}\{\text{Beta}(t+1, s') + \text{Gamma}(t+1, s', s)\}$$

Figure 7B:
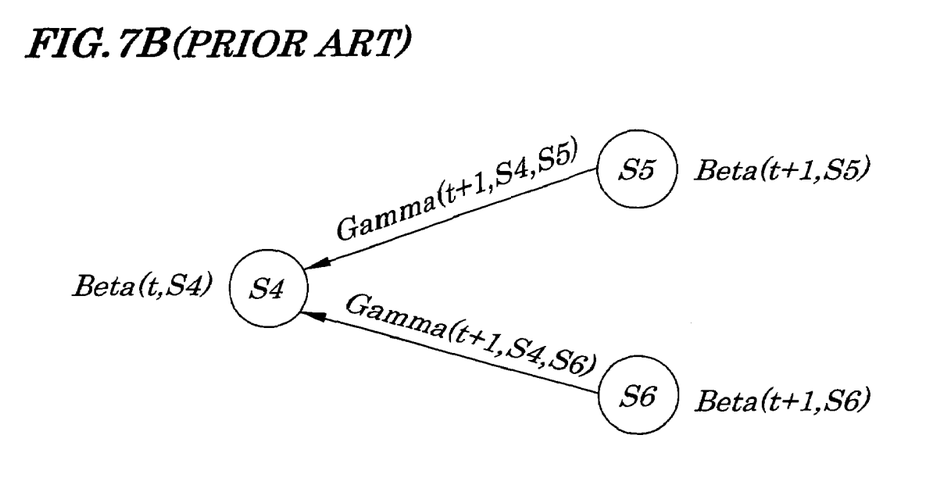

As shown in FIG. 7B, Beta (t+1, S4, S5) for the State (S4) at time point "t" is calculated as follows: Branch metric Gamma (t+1, S4, S5) and Gamma (t+1, S4, S6) are added respectively to path metric Beta (t+1, S5) and path metric Beta (t+1, S6) occurring in two rear-stage States S5 and S6 and a value being larger becomes an Alpha value in the State (this is called "Beta ACS arithmetic calculations").

This Beta calculating processing is performed in all the States at all time transitions "t" from a direction being reverse to the Alpha value (from a final State in the Trellis diagram). Since no Beta value occurs at a rear-stage in the first calculations of a Beta value, setting of an initial value is required. Here, in the final end of the Trellis diagram, as the initial Beta value, the Beta value is designated as "0" in the Stage #0 and Beta value as a "−MAX" value (minimum value) in States other than the State #0.

(c) Soft-output generating processing and extrinsic value calculations:

By addition of the Alpha value (t−1, s'), Beta value (t, s) and Gamma value (t, s', s) that have been obtained by the above calculations, all the path metric values at the time point "t" are calculated. A differential between a maximum path metric value of a path having a record result of "0" and a maximum path metric value of a path having a record result of "1" becomes a soft-output value at the time point "t".

Figure 8:
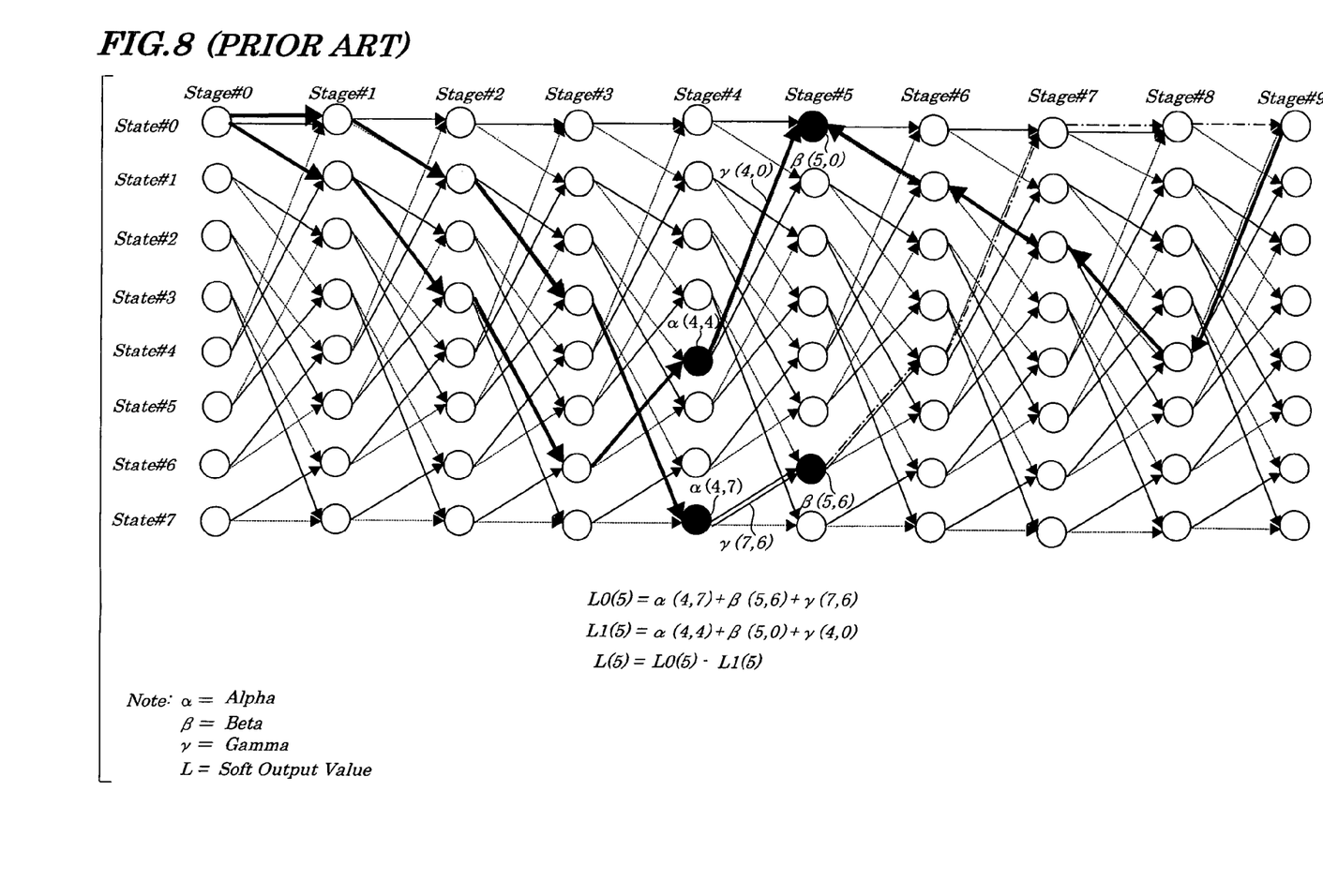
FIG. 8 is an example of calculation of a soft-output value.

As shown in FIG. 8, to all combined value (s, s') at the time point t being 5 are added the Alpha value (4, s'), Beta value (5, s) and Gamma value (5, s', s). Out of them, a maximum path metric value L0 (t) of a path having a record result of 0 is calculated. In the example, the following equation holds:

$$L0\ (t = 5) = \text{Alpha}\ (t = 4, \text{state}\ \#7) +$$
$$\text{Beta}\ (t = 5, \text{state}\ \#6) + \text{Gamma}\ (t = 5, \text{state}\ \#7, \text{state}\ \#6)$$

On the other hand, a maximum path metric value L1 (t) of a path having a record result of 1 is calculated. In the example, the following equation holds:

$$L1\ (t = 5) = \text{Alpha}\ (t = 4, \text{state}\ \#4) +$$
$$\text{Beta}\ (t = 5, \text{state}\ \#0) + \text{Gamma}\ (t = 5, \text{state}\ \#4, \text{state}\ \#0)$$

Then, a soft-output value at the time "t" being 5 is calculated as below:

$$L(t=5)=L0(t=5)-L1(t=5)$$

Also, in the Max-Log-MAP algorithm, a value obtained by deducting a channel value (value obtained from a received value) and a prior value (extrinsic information to be fed from the decoder in the rear stage) from the soft-output value (a posteriori value) obtained by the above processing becomes extrinsic information.

As described above, in the ideal Max-Log-MAP algorithm, arithmetic operations of the Alpha value and Beta value are performed at one time on all data to be decoded.

However, as a data length becomes larger in the data transmission, tremendous memory areas for the Max-Log-MAP decoding method are required. Especially, a memory area to store path metric value information of an entire Trellis diagram becomes necessary. Also, due to the increased length of data to be decoded, a delay in decoding processing increases and, therefore, it is difficult to actually apply the Max-Log-MAP decoding method to a real-time system.

To solve this problem, a sliding window method is widely used (see A. J. Viterbi, "An Intuitive Justification and a Simplified Implementation of the MAP Decoder for Convolutional Codes," IEEE J. Select. Areas Commu., Vol. 16, pp. 260-264, February 1998). In the method, only likelihood information for one window size in a Trellis diagram is stored and by making the window position be shifted until the position reaches a decoding length, considerable savings in memory can be achieved.

Moreover, to overcome the degradation in decoding capability caused by an inconstant Beta initial value at each window, prior to the calculations of Beta values, Beta training processing is performed on the Beta initial value for one window. However, as the number of times of decoding increases, reliability in the calculations of an initial value by the Beta training section is improved and excellent capability can be obtained by using a shorter training length (data training length, that is, training size).

On the other hand, when a communication environment is in a bad state, the degradation in decoding capability cannot be improved even by setting as a fixed training length for one window. As a result, since needless calculations of the Beta value training can be eliminated, due to an increase in the number of times of iterated decoding, a method of gradually shortening a value of a Beta training length is required.

Figure 9:
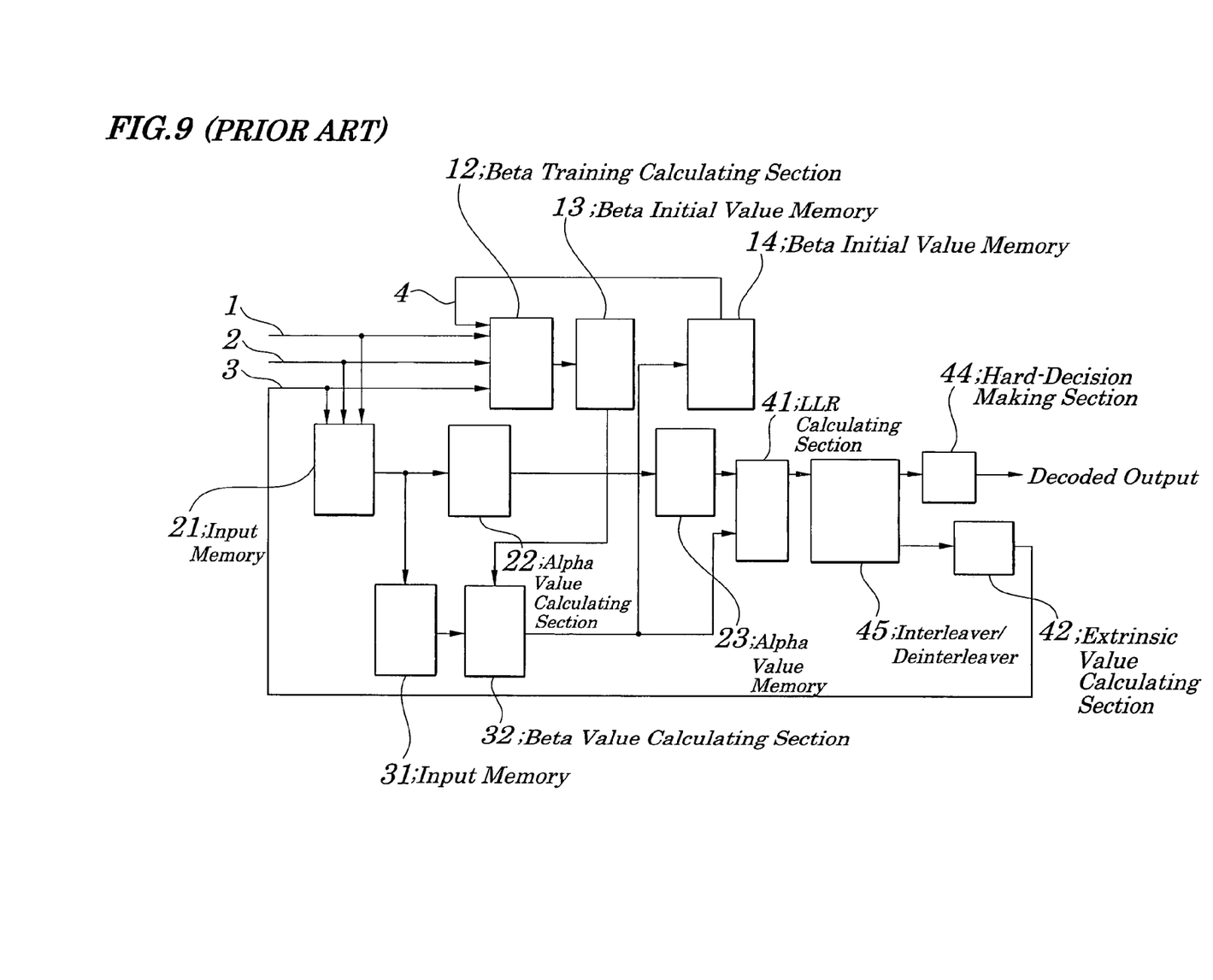
FIG. 9 is a schematic block diagram showing a function of a conventional sliding window turbo decoding.
Figure 10:
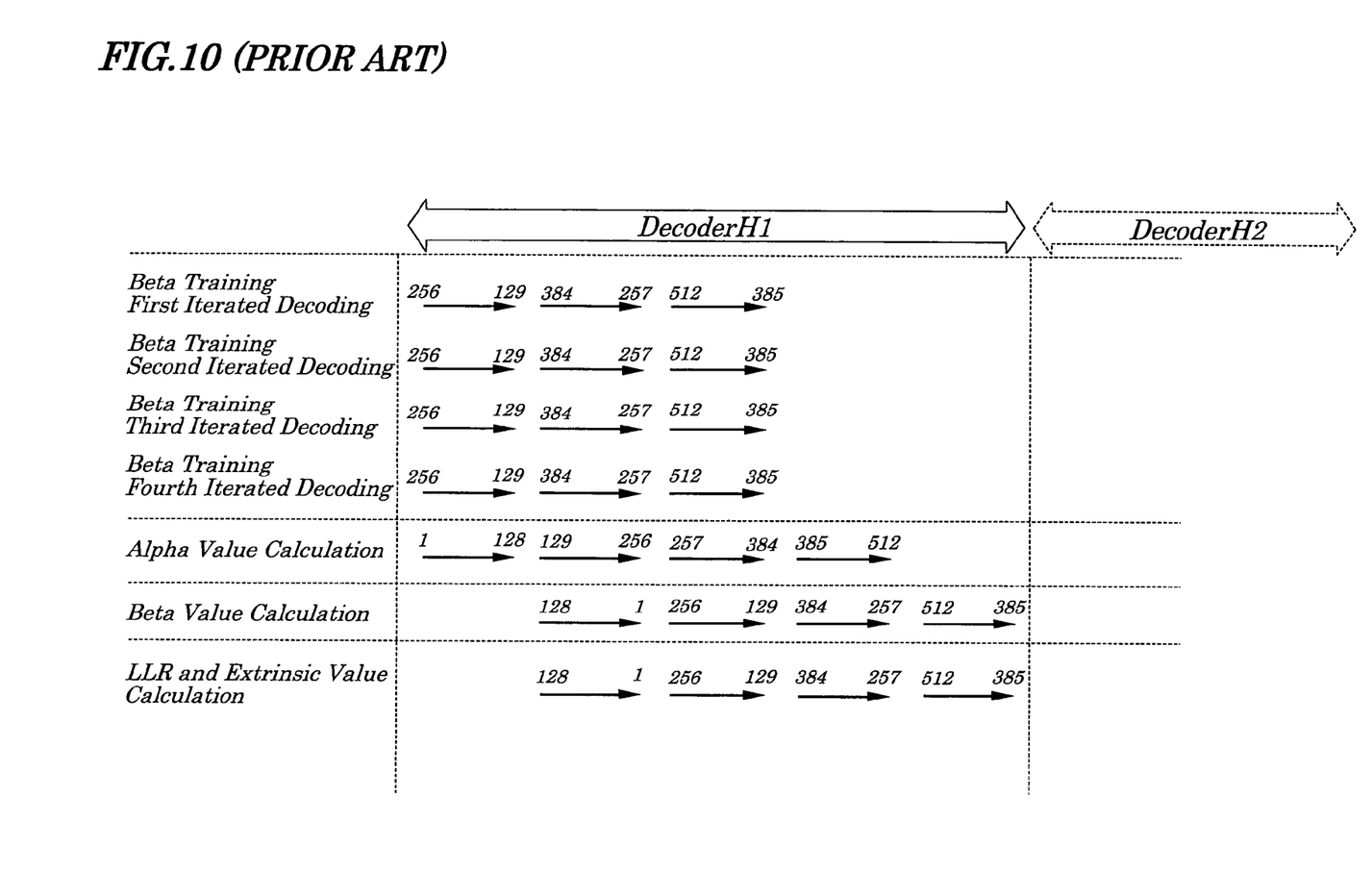
FIG. 10 is a timing chart showing operations shown in the block diagram of FIG. 9.

FIG. 9 is a block diagram showing a function of a conventional sliding window turbo decoder to perform training processing on Beta initial values prior to the Beta value calculations. FIG. 10 is a timing chart showing operational processes shown in the block diagram of FIG. 9. As shown in FIG. 9, systematic information 01 for one window, parity information 02 for one window, and extrinsic information 03 obtained by the convolutional decoder existing one before the sliding window turbo decoder are stored in the input memory 21 to perform forward processing (Alpha value calculations).

Moreover, in order to perform training processing on Beta initial values, the Beta path metric value obtained in the previous decoding iteration and stored in a Beta initial value memory 14 is used as an initial value 04 by a Beta training calculating section 12. By making a Beta value calculating section 32 calculate Beta values, a final value of a Beta value to be obtained at each window is stored in the Beta initial value memory 14. Information stored in an input memory 31 and information stored in the Beta initial value memory 14 are input to the Beta value calculating section 32.

Then, on the Beta path metric value obtained as above are done LLR (Log Likelihood Ratio, that is, soft-output value) calculations in an LLR calculating section 41 in a manner in which the calculations of the Beta path metric value are made in synchronization with that of the Alpha path metric value stored in the Alpha value memory 23. Moreover, in order to obtain an initial value for Beta training processing of subsequent decoding, a result from the Beta value calculating section 32 is also written to the Beta initial value memory 14. The result of the calculations from the LLR calculating section 41 is input through the interleaver/deinterleaver 45 to an extrinsic value calculating section 42 where the calculations of extrinsic information are done. The extrinsic information being the calculation result is used as the input extrinsic information 03 for the subsequent convolutional decoder D04 or D16 (FIG. 5).

At the time of decoding to be performed by the convolutional decoder D16 mounted at the rear stage where the number of times of decoding reaches a pre-set maximum value, the calculation result from the LLR calculating section 41 is fed to the hard-decision making section 44 for the processing of making a hard-decision.

In the above conventional sliding window turbo decoding method, as shown in the operation process diagram of FIG. 10, Beta training length is fixed. FIG. 10 shows an example in which the code block size is 512, window size is 128, and maximum number of times of decoding is four.

Next, the reason why the Beta training processing is performed is explained. To achieve an ideal decoding, in the forward processing, the Alpha values are calculated in the order of input code block lengths of 1 to 512 and the Beta values are calculated in the order of the input code block lengths of 512 to 1. However, in the sliding window turbo decoding, arithmetic operations are performed with the Alpha value calculations and with the Beta value calculations both being partitioned by windows and, therefore, it is impossible to determine an initial value of the Beta value.

For example, when the window size is 128, in the Alpha value calculations, the calculations of the Alpha values are done in the order of 1 to 128 at a first window and a value at a final window serves as an initial value in a subsequent window (129 to 256) and a final value in the subsequent window (129 to 256) serves as an initial value in a subsequent window (257 to 384) (hereafter, the same as above) and, as a result, training of the Alpha initial value at each window is not required.

On the contrary, in the Beta value calculating processes, the calculations of the Beta values are done in the order of 128 to 1, however, since the Beta value of 129 is unknown, predefined training is required. Also, at a subsequent window (256 to 129), the Beta value of 257 is unknown, predefined training is required (hereafter, the same) and training of a Beta initial value at each window is required.

Moreover, an example of the sliding window turbo decoding method is disclosed in Japanese Patent Application Laid-open No. 2002-314437.

As described above, to overcome the degradation of decoding capability caused by an inconstant Beta initial value at each window, prior to the Beta calculations, the initial value training processing for one window is performed and, with the increase in the number of times of decoding, reliability of an initial value in the Beta training section is improved, thus enabling excellent decoding capability to be obtained even by using the shorter training length.

On the other hand, when an environment of a communication channel is in a bad condition, even if a fixed training length for one window is set, it is impossible to improve the degradation in decoding capability. Therefore, in order to eliminate needless Beta training calculations, a setting method is required for gradually shortening the Beta training length by increasing the number of times of iterated decoding.

SUMMARY OF THE INVENTION

In view of the above, it is an object of the present invention to provide a turbo decoder and a turbo decoding method capable of reducing large amounts of arithmetic calculations required for decoding and of achieving decoding processing that can reduce power consumption and a program of the above turbo decoding method.

According to a first aspect of the present invention, there is provided a turbo decoder operating as a sliding window turbo decoder including:

a first decoding unit to divide an input code block into a plurality of windows and to perform forward processing and backward processing on the obtained windows;

a second decoding unit to perform forward processing and backward processing on outputs from the first decoding unit;

an iteration controlling unit to control so as to perform decoding processing to be performed by the first and second decoding units in an iterated manner;

a training unit to provide training of calculations of an initial value to be used for calculations of a path metric value in a backward direction in the backward processing;

an error detecting unit to make an error inspection of decoding output of the second decoding unit; and a size controlling unit to control so that a training size of a window in the training unit is adjusted according to a detected result of the error inspection from the error detecting unit.

In the foregoing, a preferable mode is one wherein the size controlling unit, when an inspection result from the error detecting unit indicates that an error has occurred, exercises control so as to adjust the training size.

Also, a preferable mode is one wherein the size controlling unit reduces the training size with an increase in the number of times of decoding to be performed by the first and second decoding units.

Also, a preferable mode is one wherein the size controlling unit reduces the training size by a predetermined length until a maximum number of times of decoding is reached with an increase in the number of times of decoding.

Also, a preferable mode is one wherein the size controlling unit sets the training size to be one window size during a first predetermined number of times of decoding and, during a remaining number of times of decoding, reduces the training size by a predetermined length until a maximum number of times of decoding is reached with an increase in the number of times of decoding.

Also, a preferable mode is one wherein the size controlling unit sets the training size to be one window size during a first predetermined number of times of decoding and, during a predetermined number of times of decoding thereafter, reduces the training size by a predetermined size and, during a remaining number of times of decoding, makes the training size become a size obtained after being reduced by the predetermined length.

Also, a preferable mode is one that wherein includes a stopping unit to stop decoding when an inspection result from the error detecting unit indicates that an error has occurred.

According to a second aspect of the present invention, there is provided a turbo decoding method including:

a first decoding step of dividing an input code block into a plurality of windows and of performing forward processing and backward processing on the obtained windows;

a second decoding step of performing forward processing and backward processing on outputs in the first decoding step;

an iteration controlling step of controlling so as to perform decoding processing in the first and second decoding steps in an iterated manner;

a training step of providing training of calculations of an initial value to be used for calculations of a path metric value in a backward direction in the backward processing;

an error detecting step of making an error inspection of decoding output in the second decoding step; and a size controlling step of controlling so that a training size of a window in the training step is adjusted according to a detected result of the error inspection in the error detecting step.

In the foregoing, a preferable mode is one wherein the size controlling step, when an inspection result from the error detecting step indicates that an error has occurred, exercises control so as to adjust the training size.

Also, a preferable mode is one wherein, in the size controlling step, the training size is reduced with an increase in the number of times of decoding to be performed in the first and second decoding steps.

Also, a preferable mode is one wherein, in the size controlling step, the training size is reduced by a predetermined length until a maximum number of times of decoding is reached with an increase in the number of times of decoding.

Also, a preferable mode is one wherein, in the size controlling step, the training size is set to be one window size during a first predetermined number of times of decoding and, during a remaining number of times of decoding, the training size is reduced by a predetermined length until a maximum number of times of decoding is reached with an increase in the number of times of decoding.

Also, a preferable mode is one, wherein, in the size controlling step, the training size is set to be one window size during a first predetermined number of times of decoding and, during a predetermined number of times of decoding thereafter, the training size is reduced by a predetermined size and, during a remaining number of times of decoding, the training size is made to become a size obtained after being reduced by the predetermined length.

Also, a preferable mode is one that wherein includes a stopping step of stopping decoding when an inspection result in the error detecting step indicates that an error has occurred.

According to a third aspect of the present invention, there is provided a program to make a computer execute a sliding window turbo decoding method including a first decoding step of dividing an input code block into a plurality of windows and of performing forward processing and backward processing on the obtained windows, a second decoding step of performing forward processing and backward processing on outputs in the first decoding step, an iteration controlling step of controlling so as to perform decoding processing in the first and second decoding steps in an iterated manner, a training step of providing training of calculations of an initial value to be used for calculations of a path metric value in a backward direction in the backward processing, an error detecting step of making an error inspection of decoding output in the second decoding step, and a size controlling step of controlling so that a training size of a window in the training step is adjusted according to the detected result of the error inspection in the error detecting step.

With the above configurations, large amounts of arithmetic calculations required for decoding processing can be reduced by making Beta training length be variable.

With another configuration, by using a result from the CRC (Cyclic Redundancy Check) process and by controlling the number of times of decoding, needless decoding processing can be eliminated and power consumption can be further reduced.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

Figure 1:
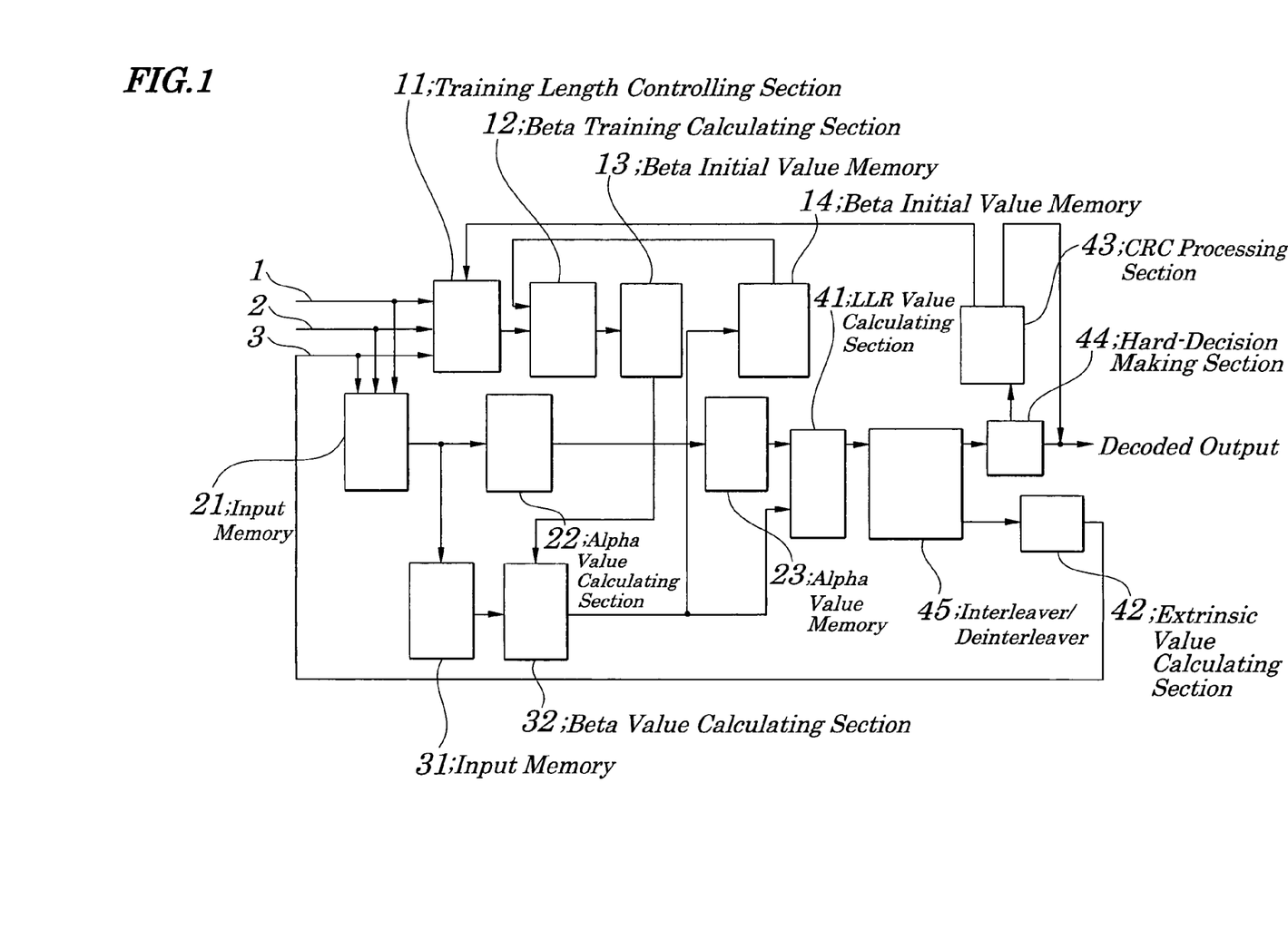
FIG. 1 is a schematic block diagram showing functions of a turbo decoder of an embodiment of the present invention.

FIG. 1 is a schematic block diagram showing functions of a turbo decoder of an embodiment of the present invention. In FIG. 1, same reference numbers are assigned to components having the same functions as a turbo decoder shown in FIG. 9. In the decoding device of the embodiment, a CRC processing section 43 to perform CRC (Cyclic Redundancy Check) processing by using a result from a decision made by a hard-decision making section 44 and a training length controlling section 11 to control a length of Beta training of input information are newly added to the components shown in FIG. 9. Functions of the components other than above are the same as those in FIG. 9.

That is, as shown in FIG. 1, systematic information 01 corresponding to one window, parity information 02 also corresponding to one window, and extrinsic information 03 obtained by the convolutional decoder existing one device before the decoding device shown in FIG. 1 are stored in an input memory 21 to undergo forward processing (Alpha calculations). Moreover, in order to perform Beta initial value training processing in a Beta training calculating section 12, control of a Beta initial value training length of input information is exercised according to a result from the CRC processing of previous iterated decoding performed by the training length controlling section 11.

By using a Beta path metric value obtained in the previous iterated decoding processing and stored in a Beta initial value memory 14 as an initial value, Beta training calculations are done by a Beta value calculating section 32. Then, to make the Beta value calculations in the Beta calculating section 32, a final Beta value that can be obtained at each window is stored in a Beta initial value memory 13.

The Alpha value calculations are done by an Alpha value calculating section 22 using information stored in the input memory 21. Moreover, to do the Beta value calculations in the Beta value calculating section 32, information stored in the input memory 21 is also written to an input memory 31. A result from the Alpha value calculations is stored in an Alpha value memory 23.

An input to the Beta value calculating section 32 includes information stored in the input memory 31 and information stored in the Beta initial value memory 13. Then, on the Beta path metric value obtained as above is performed LLR (Log Likelihood Ratio) calculation in an LLR calculating section 41 in a manner in which the calculations of the Beta path metric value are done in synchronization with that of the Alpha path metric value stored in the Alpha value memory 23. Moreover, to obtain an initial value for Beta training processing of subsequent decoding, a result from the calculations in the Beta value calculating section 32 is written to the Beta initial value memory 14.

By using the result from the LLR value calculating section 41, an extrinsic value is calculated by an extrinsic value calculating section 42. The result from the extrinsic value calculations is used as the extrinsic information 03 for the next convolutional decoder (decoder H1 corresponding to the convolutional decoder D04) or for the convolutional decoder (decoder H2 corresponding to the convolutional decoder D16). In the case of decoding by the convolutional decoder H2 of the turbo decoder, a value output from the LLR value calculating section 41 is input to the hard-decision making section 44 so that a hard decision is made. Then, by using the result from the hard-decision, the CRC processing is performed by the CRC processing section 43. The CRC processing employed in the process of turbo iterated decoding omits needless iterated steps while maintaining reliability in decoding processing which reduces amounts of processing and processing delays and adds inspection codes to information to be transferred and, at every time when iterated decoding processing is repeated, decoded information is checked and, according to a result from the inspection, whether decoding processing is further performed or not is determined.

If a result from the inspection shows that the answer is in the affirmative, an output from the hard-decision making section 44 serves as a result from decoding and decoding processing is terminated. If the result from the inspection shows that the answer is in the negative, training length control for subsequent decoding is made by the training length controlling section 11 and iterated decoding processing is continued.

Figure 2:
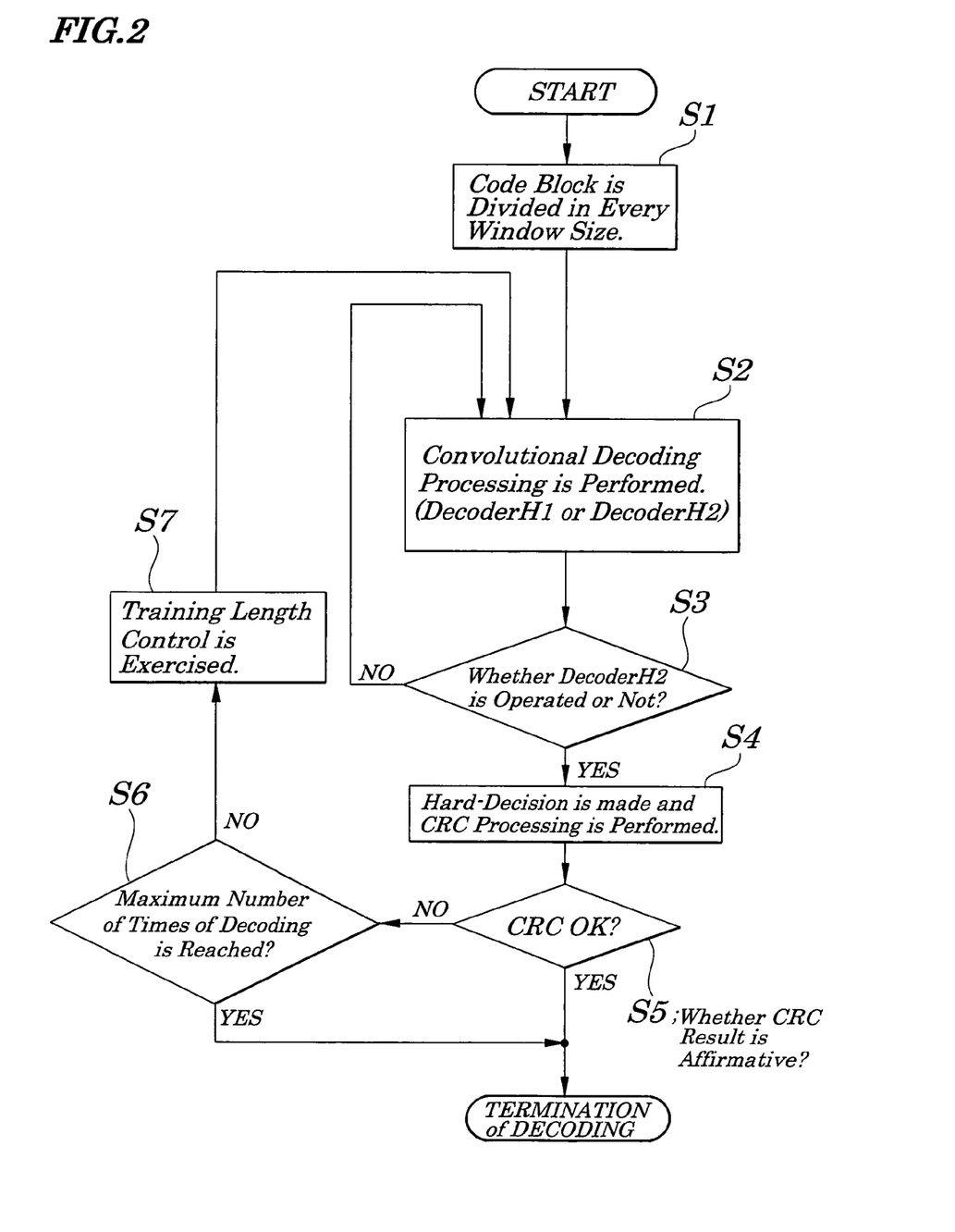
FIG. 2 is a flow chart explaining operations of the turbo decoder of the embodiment of the present invention.
Figure 3:
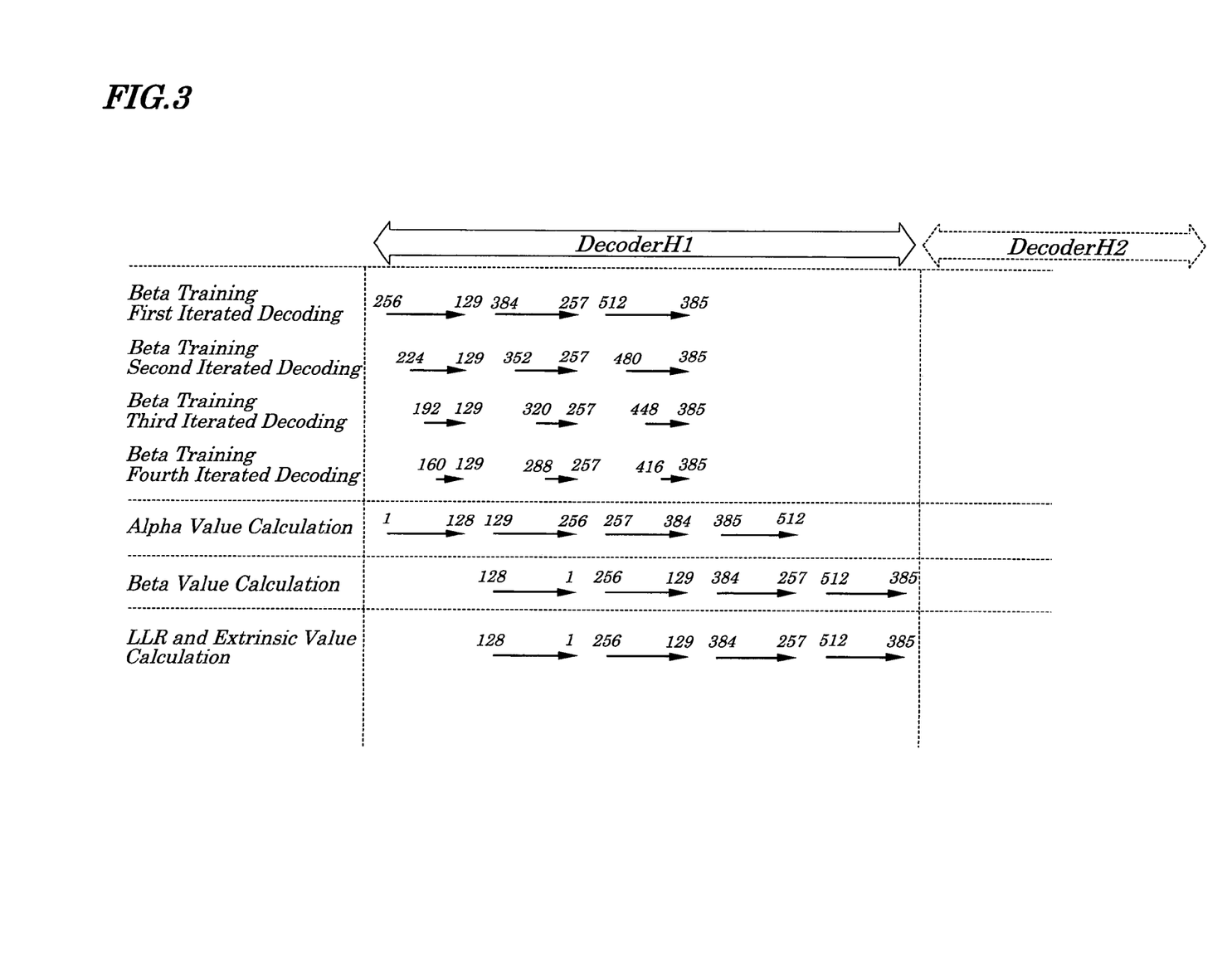
FIG. 3 is a timing chart explaining operations of the turbo decoder of the embodiment of the present invention.

Next, operations of the turbo decoder shown in FIG. 1 are described by referring to FIGS. 2 and 3. FIG. 2 is the flow chart schematically showing entire operations of the turbo decoder of the embodiment. First, one code block is divided into a plurality of windows each having a same size (Step S1). In Step S2, convolutional decoding processing is performed. That is, Beta training calculations, Alpha value calculations, Beta value calculations, LLR calculations, and extrinsic value calculations are done. Operations in Step 2 and Step 7 (training length control) are described by referring to FIG. 3.

The turbo decoder is made up of two convolutional decoders (decoder H1 and decoder H2). Actually, these two convolutional decoders are operated by one processing circuit and, therefore, circuit operations of the convolutional decoders #1 and #2 are the same. In Step S3, whether the convolutional decoder under operation is the convolutional decoder H1 or the convolutional decoder H2 is judged. If the convolutional decoder being operated at present is decoder #1, obtained extrinsic information is fed back and decoding processing by the convolutional decoder H2 is performed.

When the convolutional decoder H2 is being operated at present, a hard-decision is made by LLR information obtained above. The CRC processing is performed by using a hard-decision result (Step S4). Next, in Step S5, whether the result from the CRC processing is in the affirmative or in the negative is judged. When the result from the CRC processing is in the affirmative (no occurrence of an error), a result of a hard-decision is output and decoding processing is terminated. When the result from the CRC processing is in the negative (occurrence of an error), in Step S6, whether or not the number of times of iterated decoding at present exceeds the pre-set maximum number of times of decoding is checked. If the number of times of iterated decoding at present is the pre-set maximum number of times of decoding or less (in the case of "NO" in Step S6), the training length control is exercised on a Beta value (Step S7).

Then, extrinsic information about the decoding being performed at present is input to the convolutional decoder H1 for subsequent decoding and iterated decoding is performed. If the number of times of decoding reaches the pre-set maximum number of times of decoding ("YES" in Step S6), the decoding processing is terminated.

FIG. 2 shows an example of operations explained in Steps S2 and S7 and its details are described in FIG. 3 in which a code block size is 512, window size is 128, and maximum number of times of decoding is four.

(a) First Iterated Decoding (Iteration 1)

In the Beta training calculating section 12 for decoding, except for a first window (code block lengths=1 to 128), Beta ACS arithmetic calculations are done for every window size in a backward direction. Setting of an initial value of a fourth window (last window) in the Beta training calculating section 12 is done in the same way as employed in the ideal Max-Log-MAP algorithm described above. That is, in the decoding Trellis diagram, Alpha and Beta values in the state #0 are "0" and, in the state other than the state "0", the Alpha and Beta value are "−MAX" value (minimum value). Other initial values are not determined due to division of the code block into windows, however, in the example, all initial values are set as "0".

Beta training calculations for one window, Alpha value calculations for a window existing one before the first window, and Beta value calculations for a window existing two before the first window are done at the same time. Moreover, after the Beta training calculations for one window, only the first value is used as an initial value in the Beta value calculating section 32. While the Beta training (Beta ACS) processing is performed on the third window (code blocks=257 to 384), the Alpha calculations of the second window (code blocks=129 to 256) and Beta calculations of the first window (code blocks=1 to 128) are done at the same time. At this time point, the initial value (129) to be used in the Beta calculations can be obtained from a final value of the Beta values being a result from the Beta training calculations of the second window.

Next, the LLR and extrinsic information are calculated in a manner in which the Beta path metric value obtained from the Beta value calculations corresponds to the Alpha path metric value obtained from the Alpha value calculations at every window. Setting of the initial value in the Alpha value calculating section 22 is done in the same way as employed in the ideal Max-Log-MAP algorithm.

(b) N-th Iterated Decoding (Iteration 2 to 4)

The circuit operations for the Beta value calculations, Alpha value calculations, LLR calculations, and extrinsic value calculations are exactly the same as those employed in the above (a) operations, however, in the Beta training, as the number of times of decoding increases, the training length is gradually shortened. In the example shown in FIG. 3, at the time of the first, second, third decoding, the training length is ¾, ½, and ¼ of the window size. In actual operations, by combining the window size and the maximum number of times of decoding, various methods for controlling the training length are available.

The first controlling method is to gradually shorten the training length at a predetermined length, until the maximum number of times of decoding is reached as the number of times of decoding increases. The second controlling method is not to change the training length while first some numbers of times of decoding are performed (training length corresponding to one window size) and to shorten the training length, at a predetermined length, while the remaining number of times of decoding is performed. The third controlling method is not to change the training length while the some numbers of times of decoding are performed (training length corresponding to one window size) and to shorten the training length at a predetermined length while the subsequent some intermediate numbers of times of training are performed and again not to change the training length (the length corresponding to the final value of the variable training length) while the remaining number of times of decoding is performed.

The fourth controlling method is to shorten the training length at a predetermined length while first some numbers of times of decoding are performed and not to change the training length (the length corresponding to the last value of the variable training length) while the remaining number of times of decoding is performed. Moreover, the controlling method is not limited to the above first to fourth controlling methods.

Next, setting of an initial value in the Beta training calculating section 12 is described. Since iterated decoding is performed by the turbo decoder, in the iterated decoding to be performed second time or thereafter, the setting of an initial value is done in the Beta training calculating section 12 as described below.

That is, the setting of an initial value of a fourth window (last window) is done in the same way as employed in the ideal Max-Log-MAP algorithm. In the case of windows other than the fourth window, a final value of a Beta path metric value obtained in a window existing one after the fourth window in the previous decoding is used as an initial value to be used in the Beta training calculating section 12. For example, in the case of the second window (code blocks=129 to 256) and second decoding processing, a final value of a Beta path metric of the third window obtained in the first decoding is used as an initial value in the Beta training calculating section 12.

As described above, according to the sliding window turbo decoding method of the embodiment, a plurality of numbers of time of iterated decoding processing is performed by dividing an input code block into a plurality of windows. In every iterated decoding processing, the CRC is made and according to a result from the checking process, a training size (training length) in the training processing of an initial value required for calculations of a path metric value in the backward direction in a subsequent decoding is controlled so as to be adjusted (so as to be re-sized) and if the result from the error checking is in a good state, control is exercised to stop the decoding. This enables reduction in power consumption with decoding capability being maintained.

It is apparent that the present invention is not limited to the above embodiments but may be replaced, changed, and modified without departing from the scope and spirit of the invention. For example, the decoding algorithm applied to the present invention is the Max-Log-MAP algorithm, however, a Log-MAP algorithm that faithfully realizes MAP (Maximum A Posteriori Probability) decoding may be used. In the above embodiment, the code blocks are divided into a plurality of windows each having the same size. Even if a size of a final window is smaller than that of other window in the actual division, the present invention can be applied thereto. In this case, some contrivance is required for control of an individual training length of the final window.

Also, it is also apparent that operations shown by the flow-chart in FIG. 2 may be stored in a storing medium in a form of a program which is read by a computer.

What is claimed is:

1. A turbo decoder operating as a sliding window turbo decoder comprising:

a first decoding unit to divide an input code block into a plurality of windows and to perform forward processing and backward processing on the obtained windows;

a second decoding unit to perform forward processing and backward processing on outputs from said first decoding unit;

an iteration controlling unit to control so as to perform decoding processing to be performed by said first and second decoding units in an iterated manner;

a training unit to provide training of calculations of an initial value to be used for calculations of a path metric value in a backward direction in said backward processing;

an error detecting unit to make an error inspection of decoding output of said second decoding unit; and a size controlling unit to control so that a training size of a window in said training unit is adjusted according to a detected result of said error inspection from said error detecting unit.

2. The turbo decoder according to claim 1, wherein said size controlling unit, when an inspection result from said error detecting unit indicates that an error has occurred, exercises control so as to adjust said training size.

3. The turbo decoder according to claim 2, wherein said size contr6lling unit reduces said training size with an increase in the number of times of decoding to be performed by said first and second decoding units.

4. The turbo decoder according to claim 3, wherein said size controlling unit reduces said training size by a predetermined length until a maximum number of times of decoding is reached with an increase in said number of times of decoding.

5. The turbo decoder according to claim 3, wherein said size controlling unit sets said training size to be one window size during a first predetermined number of times of decoding and, during a remaining number of times of decoding, reduces said training size by a predetermined length until a maximum number of times of decoding is reached with an increase in said number of times of decoding.

6. The turbo decoder according to claim 3, wherein said size controlling unit sets said training size to be one window size during a first predetermined number of times of decoding and, during a predetermined number of times of decoding thereafter, reduces said training size by a predetermined size and, during a remaining number of times of decoding, makes said training size become a size obtained after being reduced by said predetermined length.

7. The turbo decoder according to claim 1, further comprising a stopping unit to stop decoding when an inspection result from said error detecting unit indicates that an error has occurred.

8. The turbo decoding method according to claim 7, further comprising a stopping step of stopping decoding when an inspection result in said error detecting step indicates that an error has occurred.

9. The turbo decoder according to claim 1, wherein the error detecting unit to make an error inspection of decoding output of only said second decoding unit.

10. A turbo decoding method comprising:
a first decoding step of dividing an input code block into a plurality of windows and of performing forward processing and backward processing on the obtained windows;
a second decoding step of performing forward processing and backward processing on outputs in said first decoding step;
an iteration controlling step of controlling so as to perform decoding processing in said first and second decoding steps in an iterated manner;
a training step of providing training of calculations of an initial value to be used for calculations of a path metric value in a backward direction in said backward processing;
an error detecting step of making an error inspection of decoding output in said second decoding step; and
a size controlling step of controlling so that a training size of a window in said training step is adjusted according to a detected result of said error inspection in said error detecting step.

11. The turbo decoding method according to claim 10, wherein said size controlling step, when an inspection result from said error detecting step indicates that an error has occurred, exercises control so as to adjust said training size.

12. The turbo decoding method according to claim 11, wherein, in said size controlling step, said training size is reduced with an increase in the number of times of decoding to be performed in said first and second decoding steps.

13. The turbo decoding method according to claim 12, wherein, in said size controlling step, said training size is reduced by a predetermined length until a maximum number of times of decoding is reached with an increase in said number of times of decoding.

14. The turbo decoding method according to claim 12, wherein, in said size controlling step, said training size is set to be one window size during a first predetermined number of times of decoding and, during a remaining number of times of decoding, said training size is reduced by a predetermined length until a maximum number of times of decoding is reached with an increase in said number of times of decoding.

15. The turbo decoding method according to claim 12, wherein, in said size controlling step, said training size is set to be one window size during a first predetermined number of times of decoding and, during a predetermined number of times of decoding thereafter, said training size is reduced by a predetermined size and, during a remaining number of times of decoding, said training size is made to become a size obtained after being reduced by said predetermined length.

16. A computer program stored on a computer readable storage medium to make a computer execute a sliding window turbo decoding method comprising a first decoding step of dividing an input code block into a plurality of windows and of performing forward processing and backward processing on the obtained windows, a second decoding step of performing forward processing and backward processing on outputs in said first decoding step, a step of controlling so as to perform decoding processing in said first and second decoding steps in an iterated manner, a training step of providing training of calculations of an initial value to be used for calculations of a path metric value in a backward direction in said backward processing, an error detecting step of making an error inspection of decoding output in said second decoding step, and a size controlling step of controlling so that a training size of a window in said training step is adjusted according to the detected result of said error inspection in said error detecting step.

17. A turbo decoder operating as a sliding window turbo decoder comprising:
a first decoding means to divide an input code block into a plurality of windows and to perform forward processing and backward processing on the obtained windows;
a second decoding means to perform forward processing and backward processing on outputs from said first decoding means;
an iteration controlling means to control so as to perform decoding processing to be performed by said first and second decoding means in an iterated manner;
a training means to provide training of calculations of an initial value to be used for calculations of a path metric value in a backward direction in said backward processing;
an error detecting means to make an error inspection of decoding output of said second decoding means; and
a size controlling means to control so that a window in said training means is re-sized in a training size according to a detected result of said error inspection from said error detecting means.

18. The turbo decoder according to claim 17, wherein said size controlling means, when an inspection result from said error detecting means indicates that an error has occurred, exercises control so as to adjust said training size.

19. The turbo decoder according to claim 18, wherein said size controlling means reduces said training size with an increase in the number of times of decoding to be performed by said first and second decoding means.

20. The turbo decoder according to claim 19, wherein said size controlling means reduces said training size by a predetermined length until a maximum number of times of decoding is reached with an increase in said number of times of decoding.

21. The turbo decoder according to claim 19, wherein said size controlling means sets said training size to be one window size during a first predetermined number of times of decoding and, during a remaining number of times of decoding, reduces said training size by a predetermined length until a maximum number of times of decoding is reached with an increase in said number of times of decoding.

22. The turbo decoder according to claim 19, wherein said size controlling means sets said training size to be one window size during a first predetermined number of times of decoding and, during a predetermined number of times of decoding thereafter, reduces said training size by a predetermined size and, during a remaining number of times of decoding, makes said training size become a size obtained after being reduced by said predetermined length.

23. The turbo decoder according to claim 17, further comprising a stopping means to stop decoding when an inspection result from said error detecting means indicates that an error has occurred.

* * * * *